(12) United States Patent
Haramoto et al.

(10) Patent No.: US 7,965,534 B2
(45) Date of Patent: Jun. 21, 2011

(54) MEMORY DEVICE, DATA RECORDING METHOD AND IC TAG

(75) Inventors: Yuichiro Haramoto, Yamanashi (JP); Takamasa Kato, Yamanashi (JP); Kohki Hiroshima, Yamanashi (JP)

(73) Assignees: Yamanashi University, Yamanashi (JP); Nippon Chemical Industrial Co., Ltd., Tokyo (JP)

( * ) Notice: Subject to any disclaimer, the term of this patent is extended or adjusted under 35 U.S.C. 154(b) by 425 days.

(21) Appl. No.: 12/301,699

(22) PCT Filed: May 18, 2007

(86) PCT No.: PCT/JP2007/060199
§ 371 (c)(1),
(2), (4) Date: Nov. 20, 2008

(87) PCT Pub. No.: WO2007/138883
PCT Pub. Date: Dec. 6, 2007

(65) Prior Publication Data
US 2009/0116276 A1    May 7, 2009

(30) Foreign Application Priority Data

May 31, 2006 (JP) .................. 2006-151785

(51) Int. Cl.
*G11C 13/04* (2006.01)
(52) U.S. Cl. ...................... 365/108; 365/215
(58) Field of Classification Search .............. 365/108, 365/215, 106; 349/1, 21, 184
See application file for complete search history.

(56) References Cited

U.S. PATENT DOCUMENTS

| | | | |
|---|---|---|---|
| 5,325,324 A * | 6/1994 | Rentzepis et al. | 365/127 |
| 5,444,651 A | 8/1995 | Yamamoto et al. | |
| 5,515,316 A | 5/1996 | Yamamoto et al. | |
| 5,532,952 A * | 7/1996 | Kreuzer et al. | 365/108 |

(Continued)

FOREIGN PATENT DOCUMENTS

JP          5-54685 A          3/1993

(Continued)

OTHER PUBLICATIONS

Y. Haramoto "Ekisho Handotai to Dodensei Spot Ekisho Memory," Expected Materials for the Future; Apr. 10, 2006; vol. 6; No. 4; pp. 22-26; cited ISR.

(Continued)

*Primary Examiner* — Vu A Le
(74) *Attorney, Agent, or Firm* — Westerman, Hattori, Daniels & Adrian, LLP

(57) ABSTRACT

A memory device of the present invention is characterized by a memory device for storing information by making use of molecular alignment of a liquid crystal compound in a liquid crystalline state formed by spot irradiation with a laser beam to carry out a selective heat treatment on an electroconductive liquid crystal semiconductor material layer containing a liquid crystal compound, comprising: a first electrode group including a plurality of linear electrodes which are parallel to each other; an electroconductive liquid crystal semiconductor material layer formed in such a manner that the layer covers the first electrode group, the layer containing a liquid crystal compound having a long linear conjugate structural moiety and exhibiting a smectic phase as a liquid crystal phase; and a second electrode group formed on the electroconductive liquid crystal semiconductor material layer and including a plurality of linear transparent electrodes being parallel to each other and extend in a direction intersecting with the first electrode group.

9 Claims, 8 Drawing Sheets

U.S. PATENT DOCUMENTS

| | | | |
|---|---|---|---|
| 7,742,112 B2 * | 6/2010 | Haramoto et al. | 349/1 |
| 2005/0162881 A1 | 7/2005 | Stasiak et al. | |
| 2006/0246643 A1 | 11/2006 | Ohsawa | |
| 2006/0255318 A1 | 11/2006 | Haramoto | |
| 2006/0278848 A1 | 12/2006 | Haramoto | |

FOREIGN PATENT DOCUMENTS

| | | |
|---|---|---|
| JP | 2004-6271 A | 1/2004 |
| JP | 2004311182 A | 11/2004 |
| JP | 2005-142233 A | 6/2005 |
| JP | 2005-217402 A | 8/2005 |
| JP | 2006-332609 A | 12/2006 |
| WO | 2004/085359 A1 | 10/2004 |
| WO | WO 2004085360 A1 | 10/2004 |

OTHER PUBLICATIONS

International Search Report of PCT/JP2007/060199, date of mailing Aug. 14, 2007.

Notification of Transmittal of Translation of the International Preliminary Report on Patentability (Form PCT/IB/338) of International Application No. PCT/JP2007/060199 mailed Dec. 24, 2008 with Forms PCT/IB/373 and PCT/ISA/237.

* cited by examiner

Rotate 45 degrees

Before the treatment with a laser beam

After the treatment with a laser beam

A sample was irradiated with a non-polarized ultraviolet light, and the emitted fluorescence was observed through a polarizing plate (Po : Transmission axis)

The angle of deposition: 45 degrees

MEMORY DEVICE, DATA RECORDING METHOD AND IC TAG

TECHNICAL FIELD

The present invention relates to a memory device, a data recording method, and an IC tag using an electroconductive liquid crystal semiconductor.

BACKGROUND ART

Organic semiconductors have been attracting attention as a semiconductor material taking the place of silicon and compound semiconductors. Production of semiconductor devices using conventional semiconductors necessarily involves high vacuum and high temperature processing operations, which has made cost reduction difficult. In contrast, use of organic semiconductor materials will make it feasible to produce semiconductor devices through a simple processing operation such as coating with a semiconductor solution or vacuum evaporation of the semiconductor material under room temperature conditions.

The inventors of the present invention previously found that a liquid crystal compound having a long linear conjugate structure and having a smectic phase as a liquid crystal phase develops excellent charge transport properties without requiring photoexcitation with a voltage applied while it is in a liquid phase of smectic phase or in a solid phase as a result of phase transfer from the smectic phase and proposed applying the liquid crystal compound to organic semiconductor devices, such as organic electroluminescent materials and thin film transistors (see, for example, Patent Document Nos. 1 to 5).

Patent Document 1: Japanese Patent Laid-Open publication No. 2004-6271
Patent Document 2: International Publication No. WO 2004/85360
Patent Document 3: International Publication No. WO 2004/85359
Patent Document 4: Japanese Patent Laid-Open publication No. 2004-311182
Patent Document 5: Japanese Patent Laid-Open publication No. 2005-142233

DISCLOSURE OF THE INVENTION

The present inventors conducted diligent research on further applications of the electroconductive liquid crystal semiconductors and found that a memory cell of a memory device can be provided through a simple process such as coating of a semiconductor solution or vacuum evaporation of the semiconductor material under room temperature conditions, and thus completed the present invention.

That is, an object of the present invention is to provide a novel memory device, and a data recording method and an IC tag using the memory device, a memory cell of the memory device being able to be produced using an electroconductive liquid crystal semiconductor through a simple process such as coating of the semiconductor solution or vacuum evaporation of the semiconductor material under room temperature conditions.

A first aspect according to the present invention is a memory device for storing information by making use of a molecular alignment of a liquid crystal compound in a liquid crystalline state, the molecular alignment being formed by spot irradiation with a laser beam to carry out a selective heat treatment on an electroconductive liquid crystal semiconductor material layer containing a liquid crystal compound, comprising:
a first electrode group including a plurality of linear electrodes which are parallel to each other;
an electroconductive liquid crystal semiconductor material layer formed in such a manner that the layer covers the first electrode group, the layer containing a liquid crystal compound having a long linear conjugate structural moiety and exhibiting a smectic phase as a liquid crystal phase; and
a second electrode group formed on the electroconductive liquid crystal semiconductor material layer and including a plurality of linear transparent electrodes which are parallel to each other and extend in a direction intersecting with the first electrode group.

A second aspect according to the present invention is a data writing method using the memory device according to the first aspect of the invention, wherein the electroconductive liquid crystal semiconductor material layer containing the liquid crystal compound is spot irradiated with the laser beam passed through the transparent electrode.

A third aspect according to the present invention is an IC tag characterized by using the memory device according to the first aspect of the invention.

BEST MODE FOR CARRYING OUT THE INVENTION

The memory device of the present invention is a memory device which stores information by making use of molecular alignment of the liquid crystal compound in a liquid crystal state, and the alignment is induced by a selective heat treatment by means of spot irradiation with a laser beam on the electroconductive liquid crystal semiconductor material layer containing the liquid crystal compound. The memory device has a first electrode group including a plurality of linear electrodes disposed parallel to each other, an electroconductive liquid crystal semiconductor material layer which is formed in such a manner that the layer covers the first electrode group, and the layer contains a liquid crystal compound having a long linear conjugate structural moiety and a smectic phase as a liquid crystal phase, and a second electrode group including a plurality of linear transparent electrodes extending parallel to each other in a direction intersecting with the electrodes of the first electrode group on the electroconductive liquid crystal semiconductor material layer.

The electroconductive liquid crystal semiconductor material layer, which serves as the memory cell in the memory device of the present invention, usually contains a liquid crystal compound with no liquid crystal molecular alignment. However, upon selective heat treatment with a laser beam, the liquid crystal molecules only in the selectively heat-treated spot align themselves in a smectic phase. This spot (a spot in a smectic liquid crystal state) exhibits not only electroconductivity but also optical anisotropy even at room temperature. Accordingly, as one of the characteristics of the memory device according to the present invention, information reading can be performed not only by an electrical method but also by an optical method simultaneously. Thus, the memory device of the present invention is provided with an excellent backup function because, even if the electrical method of reading information had a trouble, information can be read out by the optical method.

Figure 1:
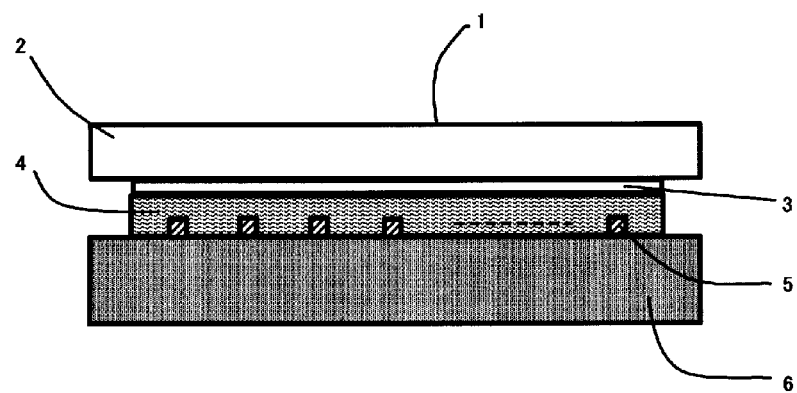
FIG. 1 is a schematic diagram showing a cross-section structure of an embodiment of a memory device according to the present invention.
Figure 2:
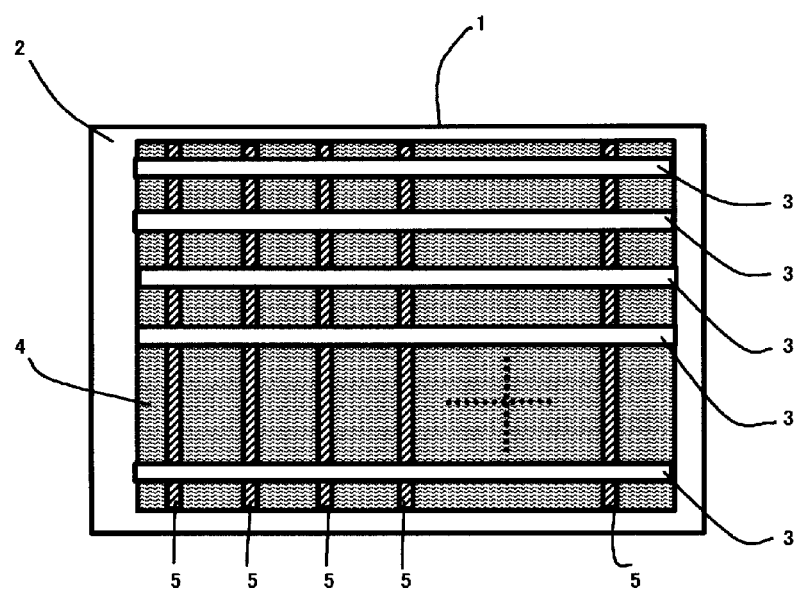
FIG. 2 is a schematic diagram showing a top structure of an embodiment of a memory device according to the present invention.

Hereinafter, an embodiment of the memory device of the present invention will be described by referring to the drawings. FIGS. 1 and 2 are schematic views of an embodiment of the memory device of the present invention.

As is shown in FIG. 1, the memory device (1) of the present embodiment is composed of a lower substrate (6), on which are provided successively the first electrode group (5), the electroconductive liquid crystal semiconductor material layer (4) containing a liquid crystal compound which has a long conjugate structure and exhibits a smectic phase as a liquid crystal phase, the second electrode group (3), and a transparent substrate (2).

The lower substrate (6) is not particularly limited in material. Examples of the materials include synthetic resins, natural resins and the like, used either individually or as a mixture, copolymer or composite thereof. Specific examples include thermoplastic resins such as polyester resins, acrylonitrile-styrene resins, acrylic resins, polyethylene resins, polypropylene resins, polyamide resins, polyacetal resins, polycarbonate resins, ABS resins, polyethylene terephthalate (PET) resins, polyvinyl chloride resins, vinyl acetate resins, polylactic acid, polyvinyl alcohol resins, polyurethane resins, modified PPO resins, polybutylene terephthalate resins, and polyphenylene sulfide resins; and polyblends or copolymers thereof. Reinforced resins such as glass-, pigment- or filler-reinforced resins are also useful. Biodegradable resins such as polylactic acid, polycarprolactone, poly(3-hydroxy-butyrate-hydroxyvalerate), and polyvinyl alcohol resins and the like are also useful. The resins recited may be used either individually or in the form of a polyblend or copolymer thereof.

The first electrode group (5) disposed on the lower substrate (6) is composed of a plurality of linear electrodes which are disposed parallel to each other as shown in FIG. 2. The material of the electrodes used for the first electrode group includes, for example, platinum, gold, silver, nickel, chromium, copper, iron, tin, antimony, lead, tantalum, indium, palladium, tellurium, rhenium, iridium, aluminum, ruthenium, germanium, molybdenum, tungsten, tin antimony oxide, indium tin oxide (ITO), fluorine-doped zinc oxide, zinc, carbon, graphite, glassy carbon, silver paste, carbon paste, lithium, beryllium, sodium, magnesium, potassium, calcium, scandium, titanium, manganese, zirconium, gallium, niobium, sodium-potassium alloy, magnesium/copper mixture, magnesium/silver mixture, magnesium/aluminum mixture, magnesium/indium mixture, aluminum/aluminum oxide mixture, lithium/aluminum mixture and the like. Known electrically conductive polymers having conductivity increased by doping, such as conductive polyaniline, conductive polypyrrole, and conductive polythiophene, polyethylenedioxythiophene-polystyrenesulfonic acid complex, and the like are also suitable for use. Preferred of them are those having small electrical resistance on the interface with a semiconductor layer.

The electroconductive liquid crystal semiconductor material layer (4) is formed in such a way as to cover the first electrode group (5). The electroconductive liquid crystal semiconductor material layer according to the present invention contains a liquid crystal compound having a long linear conjugate structural moiety and exhibiting a smectic phase as a liquid crystal phase, preferably in an amount of 70 wt % or more, especially preferably 90 wt % or more. When the content of the liquid crystal compound in the electroconductive liquid crystal semiconductor material layer is less than 70 wt %, it becomes difficult for the layer to retain the molecular alignment of a smectic phase and, thus, electroconductivity of the spot of the layer irradiated with a laser beam becomes low, causing a risk that recording of information with a laser beam may not be performed.

The liquid crystal compound having a long linear conjugate structure and exhibiting a smectic phase as a liquid crystal phase (hereinafter also referred to as "the liquid crystal compound of the present invention") is preferably exemplified by those represented by general formulae (3a) to (3g):

[Formula 1]

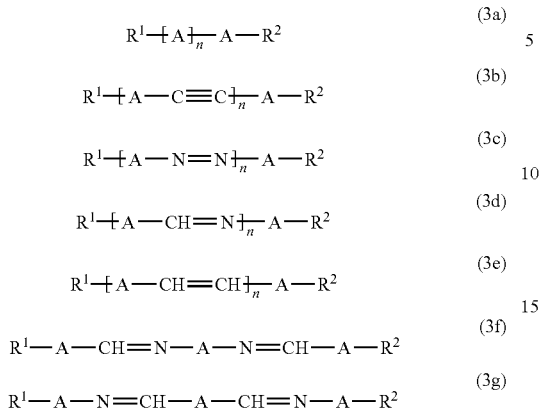

In general formulae (3a) to (3g), $R^1$ and $R^2$, which may be the same or different, represent a straight-chain or branched alkyl group, a straight-chain or branched alkoxy group, a cyano group, a nitro group, F, —C(O)O(CH$_2$)$_m$—CH$_3$, —C(O)—(CH$_2$)$_m$—CH$_3$, or a group represented by the general formula (2) below:

wherein $R^3$ represents a hydrogen atom or a methyl group; B represents —(CH$_2$)$_m$—, —(CH$_2$)$_m$—O—, —CO—O—(CH$_2$)$_m$—, —C$_6$H$_4$—CH$_2$—O—, or —CO—; m represents an integer of 1 to 18;

and n represents an integer of 1 to 3.

In general formulae (3a) to (3g), the alkyl group represented by $R^1$ and $R^2$ is preferably one having 3 to 20 carbon atoms. Specific examples of the alkyl group include, for example, a butyl group, a hexyl, heptyl group, an octyl group, a nonyl group, a decyl group, a dodecyl group, a pentadecyl group, an octadecyl group and the like. In particular, a branched alkyl group represented by a general formula, CH$_3$—(CH$_2$)$_x$—CH(CH$_3$)—(CH$_2$)$_y$—CH$_2$— (wherein x represents an integer of 0 to 7, and y represents an integer of 0 to 7), is preferable because it can increase the solubility of the compound in various solvents.

In general formulae (3a) to (3g), the alkoxy group shown by $R^1$ and $R^2$ is preferably represented by a general formula, C$_n$H$_{2n+1}$O— wherein n is an integer of 3 to 20. In particular, a branched alkoxy group represented by a general formula, CH$_3$—(CH$_2$)$_x$—CH(CH$_3$)—(CH$_2$)$_y$—CH$_2$—O— (wherein x is an integer of 0 to 7 and y is an integer of 0 to 7), is preferable because it can increase the solubility of the compound in various solvents.

Further, especially when $R^1$ and $R^2$ are a combination of an alkyl group and an alkoxy group, the solubility of the compound in various solvents can be further increased.

Furthermore, A in the general formulae (3a) to (3g) includes the groups represented by the following formulae (4a) to (4e):

[Formula 2]

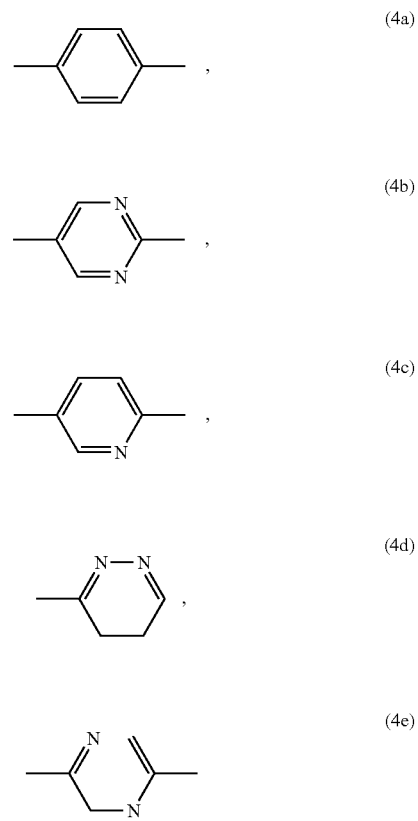

The liquid crystal compound according to the present invention (a liquid crystal compound having a long linear conjugate structural moiety and exhibiting a smectic phase as a liquid crystal phase) may be a cis-isomer, trans-isomer, or a mixture thereof.

The liquid crystal compound according to the present invention is preferably a styryl derivative represented by following general formula (1):

[Formula 3]

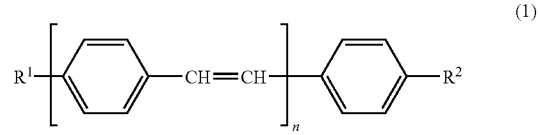

wherein $R^1$ and $R^2$ are as defined above, and n represents an integer of 2 or 3.

The styryl derivative represented by general formula (1) is easily prepared in accordance with the following reaction scheme (1), (2) or (3) shown below.

Namely, reaction scheme (1) provides a styryl derivative wherein $R^1=R^2$ and n=2 in general formula (1).

Further, reaction scheme (2) affords a styryl derivative wherein $R^1 \neq R^2$ and n=2 in general formula (1).

Furthermore, reaction scheme (3) yields a styryl derivative wherein n=3 in general formula (1).

Reaction Scheme (1)

[Formula 4]

OHC—⟨C6H4⟩—R + (Ph)2P⊕—CH2—⟨C6H4⟩—CH2—P⊕(Ph)2 · Br⊖ ⊖Br (5)         (6)

↓ Base

R—⟨C6H4⟩—CH=CH—⟨C6H4⟩—CH=CH—⟨C6H4⟩—R (1-1)

↓ heat | I2

Trans-form wherein $R=R^1=R^2$, and $R^1$ and $R^2$ are as defined above.

Specifically, the reaction of reaction scheme (1) is specifically carried out based on per mol of p-xylylenebis(triphenylphosphonium bromide) (compound (6)), using a benzaldehyde derivative (compound (5)) of an amount of preferably 2 to 4 mol, more preferably 2 to 2.5 mol, and a base (e.g., an alkoxide) of an amount of preferably 1 to 5 mol, more preferably 3.5 to 4.5 mol, in a solvent such as an alcohol (e.g., methanol or ethanol). The reaction is carried out at preferably 0° C. to 100° C., more preferably 20° C. to 50° C. for 0.5 to 50 hours, further more preferably for 5 to 30 hours. This reaction yields a desired styryl derivative of general formula (1) (compound (1-1)) (see Japanese Patent Laid-Open publication No. 2004-6271 and International Publication No. WO 2004/85360).

Reaction Scheme 2

[Formula 5]

$R^1$—⟨C6H4⟩—CH=CH—⟨C6H4⟩—CHO + $R^2$—⟨C6H4⟩—CH2—P⊕B(B)(B) X⊖

(7)         (8)

↓ Base $R^1$—⟨C6H4⟩—CH=CH—⟨C6H4⟩—CH=CH—⟨C6H4⟩—$R^2$ (1-2)

↓ heat | I2

Trans-form wherein $R^1$ and $R^2$ are as defined above; B represents a monovalent organic group such as a methyl group, an ethyl group, or a phenyl group; X represents a halogen atom such as chlorine or bromine.

The reaction of reaction scheme (2) is specifically carried out based on per mol of a benzaldehyde derivative (compound (7)), using a phosphonium salt (compound (8)) of an amount of preferably 1 to 3 mol, more preferably 1 to 1.5 mol, and a base (e.g., an alkoxide) of an amount of preferably 1 to 4 mol, more preferably 2 to 3 mol, in a solvent such as an alcohol (e.g., methanol or ethanol). The reaction is carried out at preferably −20° C. to 50° C., more preferably −5° C. to 25° C. for 1 to 20 hours, further more preferably for 5 to 15 hours. This reaction yields a desired styryl derivative of general formula (1) (compound (1-2)) (see International Publication No. WO 2004/085359).

Reaction Scheme (3)

[Formula 6]

$R^1$—⟨C6H4⟩—CH=CH—⟨C6H4⟩—CHO    $R^2$—⟨C6H4⟩—CH—CH—⟨C6H4⟩—CH2—P⊕ ⊖Br (7)         (9)

↓ Base $R^1$—⟨C6H4⟩—CH=CH—⟨C6H4⟩—CH=CH—⟨C6H4⟩—CH—CH—⟨C6H4⟩—$R^2$ (1-3)

↓ heat | I2

Trans-form wherein $R^1$ and $R^2$ are as defined above.

The reaction of reaction scheme (3) is specifically carried out based on per mol of a benzaldehyde derivative (compound (7)), using a phosphonium salt (compound (9)) of an amount of preferably 0.9 to 1.1 mol, more preferably about 1 mol, and a base (e.g., an alkoxide) of an amount of preferably 0.8 to 5 mol, more preferably about 1 mol, in a solvent such as an alcohol (e.g., methanol or ethanol). The reaction is carried out at preferably 0° C. to 150° C., more preferably 30° C. to 80° C. for 5 hours or longer, further more preferably for 10 to 30 hours. This reaction yields a desired styryl derivative of general formula (1) (compound (1-3)) (see Japanese Patent Application No. 2006-37149).

Further, the styryl derivatives obtained through the reactions in accordance with reaction schemes (1), (2), and (3), namely the compounds (1-1), (1-2), and (1-3) can be selectively converted to the corresponding trans-form by heating in a solvent in the presence of iodine. The iodine is added in an amount of 0.001 to 0.1 mol, preferably 0.005 to 0.01 mol, based on per mole of the styryl derivative (compound (1-1), (1-2) or (1-3)). The heating temperature is 100° C. to 180° C., preferably 130° C. to 150° C. Examples of the solvent that can be used for the heat treatment include benzene, toluene, o-xylene, m-xylene, p-xylene, chlorobenzene, o-dichlorobenzene, m-dichlorobenzene, p-dichlorobenzene and the like. These solvents may be used either individually or as a mixture thereof.

The electroconductive liquid crystal semiconductor material layer according to the present invention preferably contains two or more components selected from the styryl derivatives represented by general formula (1), having different alkyl chain lengths. By using such electroconductive liquid crystal semiconductor material layer, memory of the liquid crystal molecular alignment of the smectic phase improves, and the smectic molecular alignment is almost perfectly memorized even after the temperature is allowed to return to the room temperature range, and a layer with especially high electroconductivity is obtained.

In this case, a combination of the styryl derivatives themselves represented by general formula (1) having different alkyl chain lengths is preferable, and a combination of two or more derivatives having different alkyl chain lengths in a range of 3 to 18 carbon atoms is especially preferable.

In the present invention, when $R^1$ and $R^2$ are an alkoxy group, the term "alkyl chain" as used herein generally means a moiety of the alkyl group, $C_nH_{2n+1}$ in the alkoxy group, $C_nH_{2n+1}O—$. Further, in the present invention, the alkyl chain length refers to the number of carbon atoms constituting the alkyl chain.

An especially preferred combination of liquid crystal compounds for the electroconductive liquid crystal semiconductor material layer according to the present invention includes a styryl derivative (A) of general formula (1) wherein $R^1$ and $R^2$ are a group selected from alkyl groups having 12 to 18 carbon atoms or alkoxy groups represented by a general formula: $C_nH_{2n+1}O—$ (wherein n is an integer of 12 to 18), and a styryl derivative (B) of general formula (1) wherein $R^1$ and $R^2$ are a group selected from alkyl groups having 6 to 11 carbon atoms or alkoxy groups represented by a general formula: $C_nH_{2n+1}O—$ (wherein n is an integer of 6 to 11).

In the electroconductive liquid crystal semiconductor material layer of the present invention, when a mixture of two or more components of liquid crystal compounds (styryl derivatives) is formed as described above, the mixture is preferably prepared at the mixing ratio of each component where the temperature range exhibiting a smectic liquid crystal phase is 100° C. to 250° C., especially 130° C. to 250° C. When the temperature range of a smectic liquid crystal phase is 100° C. to 250° C., especially 130 to 250° C., the electroconductive liquid crystal semiconductor material layer has heat resistance at practical temperature of about 100° C. at the lowest, especially about 130° C., and exhibits high electroconductivity especially in the room temperature range, and in this respect, it is particularly preferred.

The mixing ratio of aforementioned components varies greatly depending on the styryl derivatives to be used. For example, when, as one of the preferred combinations of the present invention, that is, as the styryl derivative (A), a styryl derivative represented by general formula (1) wherein $R^1$ and $R^2$ are each an alkoxy group, $C_{15}H_{31}O—$ is used, and as the styryl derivative (B), a styryl derivative represented by general formula (1) wherein $R^1$ and $R^2$ are each an alkoxy group, $C_{10}H_{21}O—$ is used, the molar ratio of the styryl derivative (B) to the styryl derivative (A) is 0.90 to 1.10, preferably 1.

As shown in FIG. 2, the memory device (1) of the present embodiment contains a second electrode group (3) including a plurality of linear transparent electrodes extending parallel to each other in a direction intersecting with the electrodes of the first electrode group (5) on the electroconductive liquid crystal semiconductor material layer (4). The kind of transparent electrodes which can be used is not particularly limited. For example, ITO, ZnO, PEDOT-PSS may be used.

On the second electrode group (3), a transparent substrate (2) is disposed. The material of the transparent substrate is not particularly limited and includes, for example, glass; polyesters such as polyethylene terephthalate (PET) and polyethylene naphthalate; polyolefins such as polyethylene, polypropylene, polystyrene, and EVA; vinyl resins such as polyvinyl chloride and polyvinylidene chloride; polysulfones; polyethersulfones; polycarbonates; polyamides; polyimides; acrylic resins; methacrylate; and triacetate cellulose.

The memory device (1) of the present embodiment having above-mentioned structure can be produced, for example, by the following Production Examples 1 and 2.

Production Example 1

Figure 3:
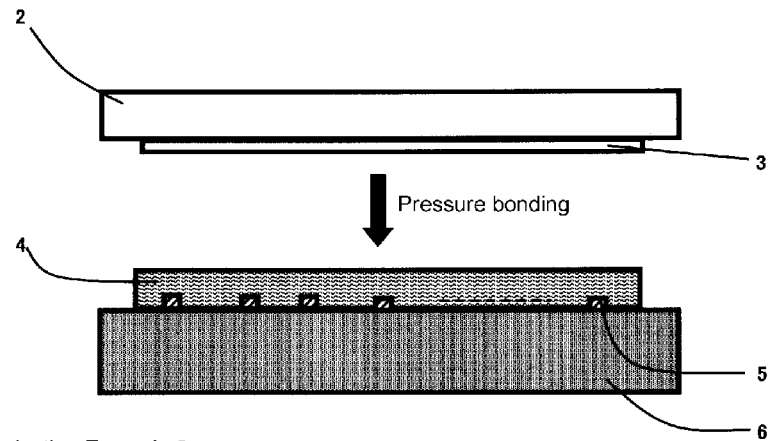
FIG. 3 is a schematic diagram illustrating production examples of an embodiment of a memory device according to the present invention.
Figure 3:
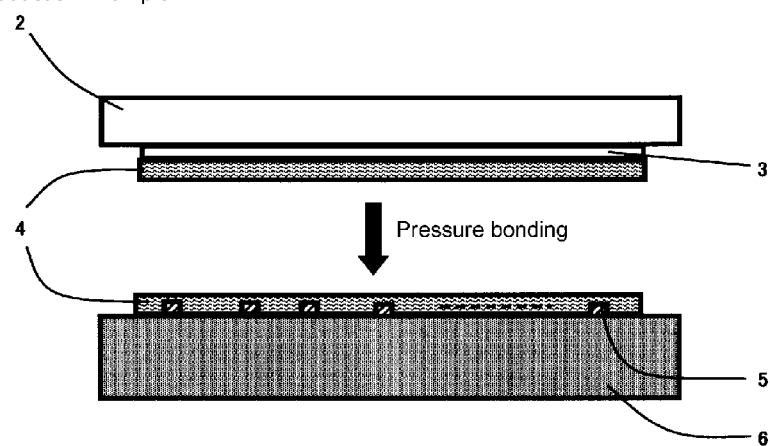

The first electrode group (5) and the second electrode group (3) containing the transparent electrodes are formed on the lower substrate (6) and on the transparent substrate (2), respectively. Then, on the lower substrate (6) with the electrode group (5) disposed thereon, the layer containing the liquid crystal compound having a smectic phase as the liquid crystal phase is formed to cover the electrode group (5), thus providing the electroconductive liquid crystal semiconductor material layer (4). The lower substrate (6) provided with the electroconductive liquid crystal semiconductor material layer (4) and the transparent substrate (2) provided with an electrode group (3) are pressure bonded. (See Production Example 1, FIG. 3)

Production Example 2

The first electrode group (5) and the second electrode group (3) containing transparent electrodes are formed on the lower substrate (6) and on the transparent substrate (2), respectively. Then, the electroconductive liquid crystal semiconductor material layer (4) containing liquid crystals having a smectic phase is formed on the transparent electrodes as a liquid crystal phase. Meanwhile, the electroconductive liquid crystal material layer (4) containing the liquid crystal compound having a smectic phase as a liquid crystal phase is also formed on the lower substrate (6), on which the first electrode group (5) is formed, to cover the electrode group (5). The lower substrate (6) and the transparent substrate (2) thus prepared are pressure bonded on the electroconductive liquid crystal semiconductor material layer (4) (See Production Example 2, FIG. 3).

As a method to form the electrodes, there may be mentioned a method where an electroconductive thin film formed by vacuum evaporation, sputtering and the like of the aforementioned electrode material, is patterned into electrodes by a publicly known photolithography or a lift-off method. There is also a method where metal foil of aluminum, copper, and the like is etched by using a resist applied thereon by thermal transfer, inkjet, and the like. Further, electrodes may be patterned directly by inkjet printing with a solution or dispersion of an electroconductive polymer, or a dispersion of electroconductive particles, or a film obtained by coating the solution or dispersion may be patterned into electrodes by lithography, laser abrasion, and the like. Furthermore, there may also be used a method wherein electrodes are patterned by printing an ink, conductive paste, and the like containing electroconductive polymers or conductive particles by letterpress printing, intaglio printing, planography, screen printing, and the like.

Further, methods to form the electroconductive liquid crystal semiconductor material layer include, for example, vacuum evaporation, oblique vacuum evaporation, a method of forming a layer by coating a solution of the liquid crystal compound in a solvent by printing, dip coating, or spin coating. In addition, examples of suitable printing methods include, but are not limited to, screen printing and inkjet printing and the like.

The following is a specific example of a method for producing the memory device (1) shown in FIG. 1. In addition, the styryl derivative (a liquid crystal compound) used in this specific example can be prepared by the procedures (Synthetic Examples 1 and 2) shown in the Examples section as described later.

Specific Example of a Method for Producing the Memory Device (1)

The first electrode group (5) including a plurality of linear silver electrodes disposed parallel to each other was prepared by screen printing a commercial conductive paste on a lower substrate (6) of polyethylene terephtahalate (size 2×2 mm, thickness 0.7 mm), the paste containing 75 wt % of silver, 15 wt % of a binder resin, and 10 wt % of a solvent, and through preliminary drying at 50° C. for 20 minutes, baking was conducted at 150° C. for 30 minutes.

Next, 40 mg of an equimolar mixture of the styryl derivatives (A) and (B) obtained in Synthetic Examples 1 and 2 (see the sections in Examples as described later), was placed on the sample board and was fitted to the vacuum evaporation system. The distance between the substrate and the evaporation material was set to 12 cm, vacuum evaporation was conducted while monitoring the state of vaporization by means of a vacuometer. After completion of the vacuum evaporation, nitrogen gas was introduced through a desiccant bed into the chamber for the system to return to the atmospheric pressure, and an electroconductive liquid crystal semiconductor material layer (4) of, for example, 300 nm in thickness was prepared.

Meanwhile, the second electrode group (3) including a plurality of parallel, linear ITO electrodes were prepared by photolithography of an ITO thin film formed on a transparent polycarbonate substrate (2) (size 2×2 mm, thickness 0.7 mm) by a sputtering method. Then, onto this transparent substrate (2) provided with the electrode group (3), the lower substrate (6) having the electroconductive liquid crystal semiconductor material layer (4) formed in the above was pressure bonded to produce the memory device (1).

The memory device of the present invention records data by heat treating the electroconductive liquid crystal semiconductor material layer containing the liquid crystal compound by spot-irradiation with a laser beam which is transmitted through the transparent electrodes.

In the memory device (1) of the present embodiment, the electroconductive liquid crystal material layer (4) containing aforementioned liquid crystal compound with no liquid crystal molecular alignment is selectively heat treated by spot-irradiation with a laser beam, spots having two properties, the electroconductivity and the optical anisotropy simultaneously are formed by generating the molecular alignment of the liquid crystal compound in a liquid crystal state, information is recorded by making use of an electroconductive spot and a non-electroconductive spot, and the difference in optical anisotropy of the spots, and information is read by either an electrical method or an optical method. Data writing by using this memory device (1) can be carried out, for example, as follows.

Figure 4:
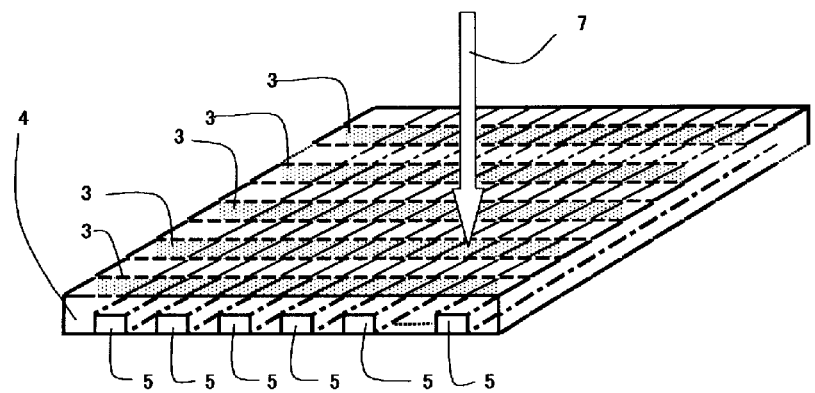
FIG. 4 is a schematic perspective view showing positions of a memory device to be spot irradiated by a laser beam in an embodiment of a memory device according to the present invention.
Figure 5:
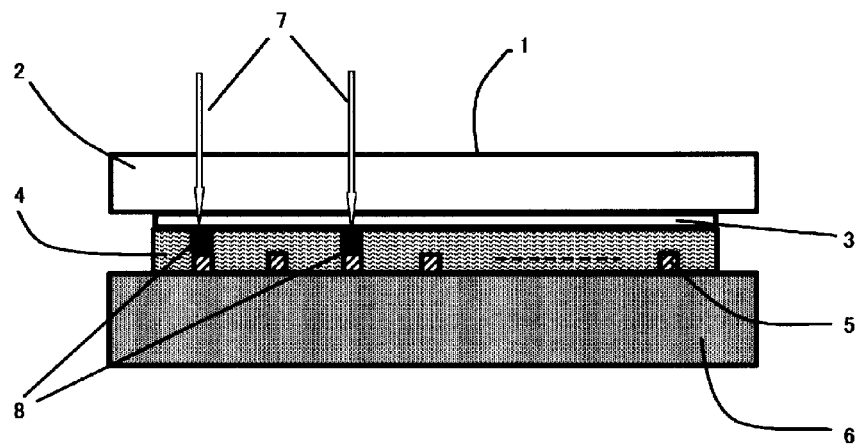
FIG. 5 is a schematic cross-section view showing the state in the memory device after spot irradiation thereof with a laser beam in an embodiment of a memory device according to the present invention.

Namely, as shown in FIGS. 4 and 5, data writing using the memory device (1) of the present embodiment can be carried out by spot irradiating the electroconductive liquid crystalline semiconductor material layer (4) with a laser beam (7) for selective heat treatment at the cross-points of the electrodes of the first electrode group (5) and the transparent electrodes of the second electrode group (3), the laser beam (7) being transmitted through the transparent electrodes of the second electrode group (3). The electroconductive liquid crystal semiconductor material layer (the electroconductive liquid crystal semiconductor material layer containing a liquid crystal compound with no liquid crystal molecular alignment) not treated with a laser beam is electrically insulating. In contrast, only the spot (conductive spot (8)) treated with a laser beam is transformed into a liquid crystal state of a smectic phase, which, after irradiation with a laser beam, shows extremely high electroconductivity and optical anisotropy in a solid state where the molecular alignment of a smectic phase is almost perfectly maintained even at room temperature. Therefore, for example, by selectively forming spots of a smectic liquid crystal state by spot irradiating with a laser beam the electroconductive liquid crystalline semiconductor material layer (4) which is in an electric insulating state and does not show optical anisotropy, the spot shows extremely high electric conductivity and optical anisotropy, and thus data writing can be conducted simultaneously by the electric conductive portion and non-conductive portion, and by the difference in the optical anisotropy.

Further, data can be written clearly when an energy density of the laser beam to irradiate is especially $10 \times 10^3$ W/cm$^2$ or higher, preferably $15 \times 10^3$ W/cm$^2$ or higher, especially preferably $15 \times 10^3$ to $35 \times 10^3$ W/cm$^2$. In addition, other conditions such as wavelength and the like are not particularly limited.

In the memory device of the present invention, the proportion of the "liquid crystal compound with no liquid crystal molecular alignment" in all liquid crystal compounds contained in the electroconductive liquid crystal semiconductor material layer is, before data writing (before laser beam irradiation) is preferably 95 wt % or more, more preferably 99 wt % or more. With that proportion being less than 95 wt %, there is a risk that the reliability of the data recorded decreases.

Figure 6:
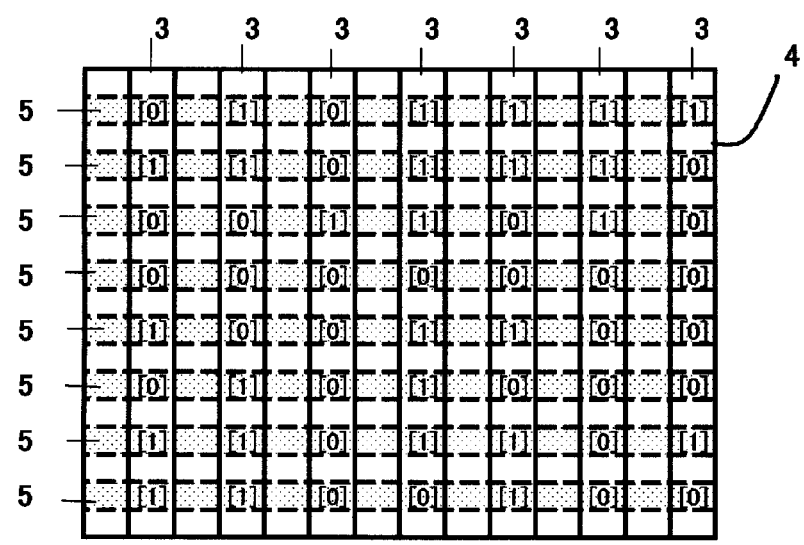
FIG. 6 is a schematic diagram showing bits 0 and 1 written in the electroconductive liquid crystal semiconductor material layer of the memory device after spot irradiation thereof with a laser beam in an embodiment of a memory device according to the present invention.

As illustrated in FIG. 6, data is written on the electroconductive liquid crystal semiconductor material layer (4) by the above-mentioned heat treatment in terms of the binary data "0" and "1", with spots "1" corresponding to a smectic liquid crystal state with high conductivity and high optical anisotropy, and spots "0" with low conductivity and high optical anisotropy.

Further, in the memory device of the present invention, the spot on the electroconductive liquid crystal semiconductor material layer, selectively heat treated by spot irradiation with a laser beam, emits fluorescence polarized in the molecular long axis direction of the liquid crystal compound. Therefore, by controlling the molecular long axis direction of the liquid crystal compound, optical mutiplex writing on the same spot can be performed. Namely, the data writing method using the memory device of the present invention includes an embodiment in which the electroconductive liquid crystal semiconductor material layer containing the liquid crystal compound is spot irradiated with a laser beam to carry out a selective heat treatment, the molecular alignment of the liquid crystal compound in a liquid crystal state is generated, a spot which emits fluorescence polarized in the of the molecular long axis direction of the liquid crystal compound is formed, and thus the optical multiplex writing is performed on the same spot.

Readout of the data recorded by the aforementioned data writing method of the memory device (readout of data recorded in a multiplex mode) can be carried out by irradiating the spots which emit fluorescence polarized in the molecular long axis direction of the liquid crystal compound with exciting light, and by aligning the transmission axis of a polarizing plate with the oscillation direction of thus emitted polarized fluorescence.

The memory device of the present invention, into which the binary data "0" and "1" was written, can be read out by connecting the device to an existing readout circuit.

The smectic liquid crystal state of the electroconductive liquid crystal semiconductor material layer is reversible. By disturbing the molecular alignment by providing a vibration by ultrasonic waves during the cooling from the liquid crystal state, the layer can be converted from the smectic liquid crystal state to an amorphous state which shows low conductivity and high optical anisotropy.

Figure 7:
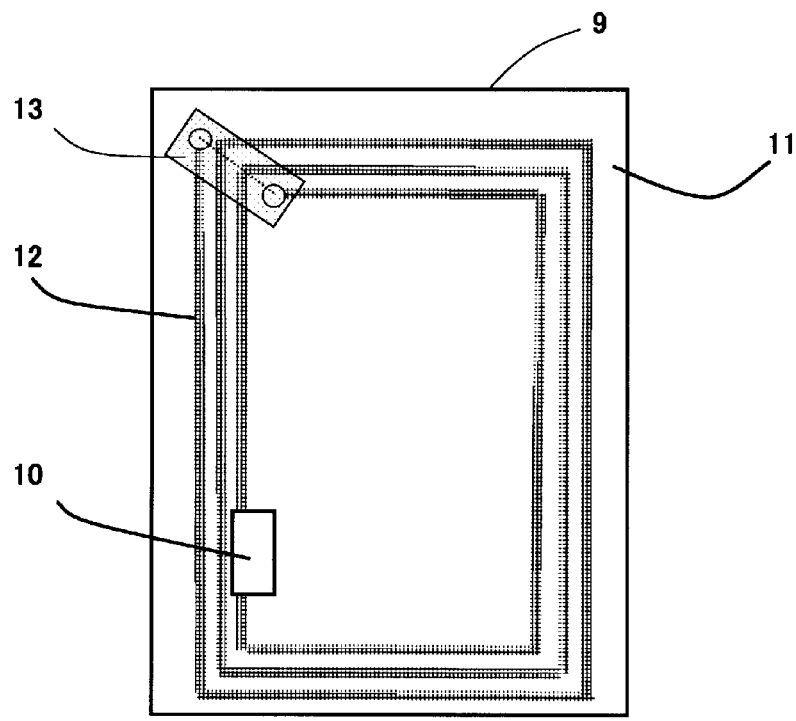
FIG. 7 is a schematic diagram showing a top structure in an embodiment of an IC tag according to the present invention.

The IC tag according to the present invention will then be described. The IC tag of the invention is characterized by using the memory device of the present invention described above. The IC tag of the present invention will be described with reference to FIG. 7. FIG. 7 is a plan of an exemplary embodiment of the IC tag of the present invention.

As illustrated in FIG. 7, an IC tag (9) includes a plastic substrate (11) of film form, an antenna (12) provided on the plastic substrate (11), and an integrated circuit (10) provided on the plastic substrate (11). An insulating layer (13) is provided to cover the antenna wire which constitutes the antenna (12) between the starting point and end point. A jumper is provided over the insulating layer (13). The memory device of the present invention described above is mounted on the integrated circuit (10). The IC tag (9) may further have a protective film on its surface. The back side of the IC tag (9) may be made pressure-adhesive so that the tag may be stuck even to an article with a curved surface such as a bag of sweets or a beverage can.

The material making the plastic substrate film (11) of film form is not particularly limited, and resins generally used in IC cards and IC tags can be used. Examples of the material include synthetic resins and natural resins, which are used individually, or as a mixture, copolymer, or composite thereof. Specific examples include thermoplastic resins such as polyester resins, acrylonitirile-styrene resins, acrylic resins, polyethylene resins, polypropylene resins, polyamide resins, polyacetal resins, polycarbonate resins, ABS resins, polyethylene terephthalate (PET) resins, polyvinyl chloride resins, vinyl acetate resins, polylactic acid, polyvinyl alcohol resins, polyurethane resins, modified PPO resins, polybutylene terephthalate resins, and polyphenylene sulfide resins; or mixtures of resins by compounding these materials, copolymers thereof, and the like; and further include resins reinforced by addition of glass fiber, pigments, and fillers. Biodegradable resins such as polylactic acid, polycaprolactone, poly(3-hydroxy-butyrate-hydroxyvalerate), and polyvinyl alcohol resins may be used, and further the resins are used individually, or as a mixture or copolymer thereof.

The material of antenna (12) includes, for example, platinum, gold, silver, nickel, chromium, copper, iron, tin, antimony, lead, tantalum, indium, palladium, tellurium, rhenium, iridium, aluminum, ruthenium, germanium, molybdenum, tungsten, tin-antimony oxide, indium-tin oxide (ITO), fluorine-doped zinc oxide, zinc, carbon, graphite, glassy carbon, silver paste, carbon paste, lithium, beryllium, sodium, magnesium, potassium, calcium, scandium, titanium, manganese, zirconium, gallium, niobium, sodium-potassium alloy, magnesium/copper mixture, magnesium/silver mixture, magnesium/aluminum mixture, magnesium/indium mixture, aluminum/aluminum oxide mixture, lithium/aluminum mixture and the like. Further, known electroconductive polymers having the conductivity increased by doping and the like, such as conductive polyaniline, conductive polypyrrole, conductive polythiophene, polyethylenedioxythiophene-polystyrene sulfonic acid complex, and the like may also be used suitably.

The antenna (12) can be formed by known techniques. Printing techniques such as screen printing, offset printing, gravure printing, inkjet printing and the like are preferred. When the printing technique is applied, a binder resin may be incorporated to a conductive paste to improve the adhesion to the substrate.

After the antenna (12) is formed, the integrated circuit (10) having the memory device of the present invention is mounted to produce an IC tag. As an adhesive material to connect the integrated circuit and the antenna, known anisotropic conductive film, anisotropic conductive paste, insulating paste and the like may be used. The adhesive material can be applied by, for example, a dispenser method, printing, and the like.

The following is a specific example of the production method of the IC tag (9) shown in FIG. 7. The memory device used in this specific example can be produced in accordance with the above-described <Specific example of a method for producing the memory device (1)>.

Specific Example of a Method for Producing IC Tag (9)

A commercially available conductive paste consisting of 75 wt % of silver, 15 wt % of a binder resin, and 10 wt % of a solvent was screen printed on a polyethylene terephthalate substrate (11) in a loop antenna pattern, the printed resultant was preliminarily dried at 50° C. for 20 minutes, and baked at 150° C. for 30 minutes to form an antenna (12).

A commercially available insulating paste was printed twice to a portion where a jumper is to be formed. The same conductive paste as used to form the antenna was screen printed on the resulting insulating layer to form a jumper.

A memory device (1) and a signal circuit IC (not shown) are mounted on the both ends of the antenna as the integrated circuit (10) via ACF (anisotropic conductive film (adhesive tape)) to produce an IC tag (9).

In the foregoing, the memory element and IC tag according to one embodiment of the present invention have been described but the invention is not limited to these. For example, in the IC tag, the layout and constitution of the antenna and integrated circuit may be designed optionally, and also, it is possible to incorporate a logic circuit such as a signal processing IC.

EXAMPLES

The present invention will now be illustrated in greater detail with reference to Examples, but it should be understood that the present invention is not deemed to be limited thereto.
(Preparation of Styryl Derivatives)

Synthesis Example 1

Styryl Derivative (A)

Synthesis of
1,4-bis(4'-pentadecanoxystyryl)benzene-(E,E)

(1) p-Pentadecanoxybenzaldehyde was prepared by the steps described below in accordance with the following reaction scheme.

[Formula 7]

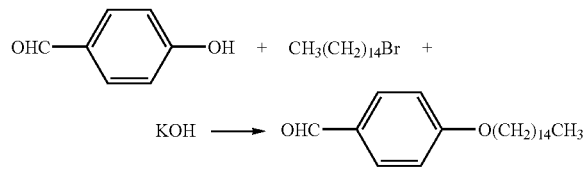

In a 100 ml four-necked flask, 2.79 g (42.3 mM) of 85 wt % potassium hydroxide was suspended in 30 ml of dimethylformamide, and 10 ml of a dimethylformamide solution containing 5.28 g (43.2 mM) of hydroxybenzaldehyde was added dropwise while maintaining the system at 20° C. or lower, and the resultant was aged at 30° C. for 1 hour. Next, 9.58 g (32.9 mM) of 1-bromopentadecane was added, and the resultant was aged at 70° C. for 21 hours. The reaction mixture was dispersed in water and extracted with toluene. The extract was washed with water and concentrated to give 11.03 g of a slightly colored viscous liquid. Recrystallization from hexane gave 8.91 g of p-pentadecanoxybenzaldehyde (purity: 98.3%).

(2) A 1,4-bis(4'-pentadecanoxystyryl)benzene isomeric mixture (compound (1a)) was prepared by the steps described below in accordance with the following reaction scheme.

In a 30 ml four-necked flask, 7.87 g (23.7 mM) of the p-pentadecanoxybenzaldehyde synthesized above and 8.65 g (11.0 mM) of p-xylylenebis(triphenylphosphonium bromide) were suspended in 100 ml of methanol, and 6.87 g (35.6 mM) of 28 wt % methylate was added dropwise at room temperature (25° C.). The resultant mixture was aged at a refluxing temperature of 65° C. for 3 hours. Methanol was removed by evaporation, and 200 ml of water was added to the residue, and the resultant was stirred. The precipitate formed was collected by filtration, washed with water and acetone, and dried to give 7.49 g of a 1,4-bis(4'-pentadecanoxystyryl)benzene isomeric mixture (compound (1a)). The $^1$H-NMR data for identification were as follows.

$^1$H-NMR: 7.45 ppm (4H, s), 7.42 (4H, d), 7.06 (2H, d), 6.94 (2H, d), 6.88 (4H, d), 3.96 (4H, t), 1.78 (4H, m), 1.2-1.5 (48H, m), 0.87 (6H, t)

(3) 1,4-Bis(4'-pentadecanoxystyryl)benzene-(E,E) was prepared as follows.

In a 100 ml egg flask, 7.49 g (10.2 mM) of the 1,4-bis(4'-pentadecanoxy-styryl)benzene isomeric mixture synthesized above and 20 mg (0.08 mM) of iodine were suspended in 50 ml of p-xylene, and the resultant was aged under reflux at 139° C. for 8 hours. After completion of the reaction, the precipitate formed was collected by filtration and dried to yield 7.06 g (purity: 99.9%) of 1,4-bis(4'-pentadecanoxystyryl)benzene-(E,E). The $^1$H-NMR data for identification were as follows.

$^1$H-NMR: 7.45 ppm (4H, s), 7.42 (4H, d), 7.06 (2H, d), 6.94 (2H, d), 6.88 (4H, d), 3.96 (4H, t), 1.78 (4H, m), 1.2-1.5 (48H, m), 0.87 (6H, t)

Synthesis Example 2

Styryl Derivative (B)

Synthesis of
1,4-Bis(4'-decanoxystyryl)benzene-(E,E)

The conditions and procedures of Synthesis Example 1 were repeated except for replacing 1-bromopentadecane with 1-bromodecane to yield 3.43 g (purity: 99.9%) of 1,4-bis(4'-decanoxystyryl)benzene-(E,E) represented by general formula (Ib). The $^1$H-NMR data for identification are shown below.

$^1$H-NMR: 7.45 ppm (4H, s), 7.43 (4H, d), 7.06 (2H, d), 6.94 (2H, d), 6.87 (4H, d), 3.98 (4H, t), 1.77 (4H, m), 1.2-1.5 (28H, m), 0.88 (6H, t).

[Formula 8]

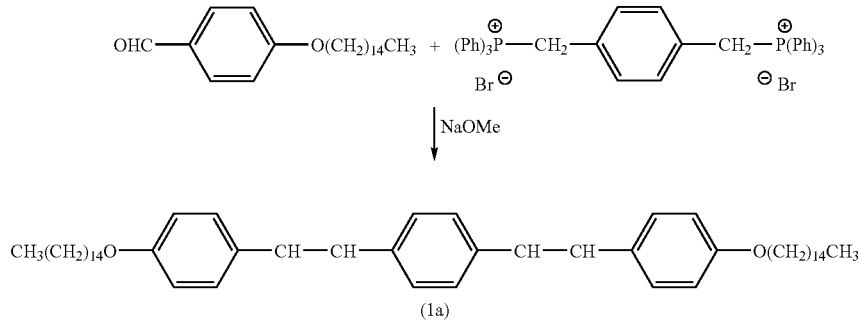

[Formula 9]

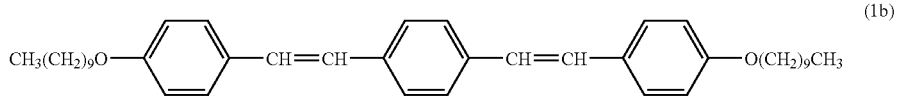

(1b)

The styryl derivatives obtained in Synthesis Examples 1 and 2 were found to exhibit the phase transitions shown in Table 1 below by observation of the textures of the liquid crystal phase appeared in a polarizing microscope.

TABLE 1

| | Phase Transition (° C.) |
|---|---|
| Synthesis Example 1 | C 138 SmG 170 SmF 226 SmC 308 N 310 I |
| Synthesis Example 2 | C 98 SmG 187 SmF 250 SmC 255 N 270 I |

Note.
C: crystal, SmG: smectic G phase, SmF: smectic F phase, SmC: smectic C phase, N: nematic phase, I: isotropic liquid <Evaluation of Electroconductive Liquid Crystal Semiconductor Material Layer>

(1-1)

Four glass substrates (size 2×2 mm, thickness 0.7 mm) having an ITO electrode were each spin coated with poly(3,4-ethylenedioxy-thiophene)-polystyrene sulfonate (hereinafter abbreviated as PEDOT-PSS). The unnecessary portion of the PEDOT-PSS on the substrate was removed with isopropyl alcohol, and the PEDOT-PSS was cured by heating at 200° C. for 30 minutes to form a PEDOT-PSS layer (thickness: 0.1 μm).

The substrates were set in a vacuum evaporation system, and 40 mg of an equimolar mixture of the styryl derivatives obtained in Synthesis Examples 1 and 2 was placed on the sample board and fitted to the evaporation system. The distance between the substrate and the evaporation material was set to 12 cm. Electrical current was applied to the sample boat to carry out vacuum evaporation while monitoring the state of evaporation by means of a vacuometer. After completion of the vacuum evaporation, nitrogen gas passed through a desiccant bed into the vacuum chamber for the system to return to atmospheric pressure. An electroconductive liquid crystal layer with a thickness of 300 nm containing the styryl derivatives was thus formed.

The phase transitions of a film of the aforementioned electroconductive liquid crystal semiconductor (compounds obtained in Synthesis Examples 1 and 2) are shown in Table 2.

TABLE 2

| | Phase Transfer (° C.) |
|---|---|
| Liquid Crystal Composition | C 90 SmG 120 SmF 210 SmC 225 N 231 I |

Figure 8:
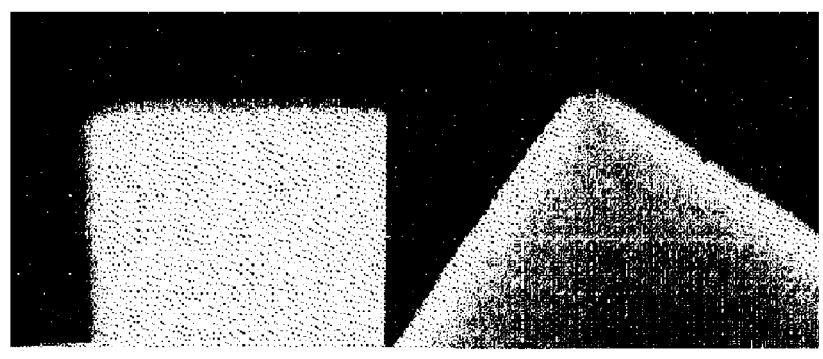
FIG. 8 shows polarizing microphotographs of the electroconductive liquid crystal semiconductor material layer prepared in Example that is in a solid state after being heated at 150° C. for 3 minutes followed by being allowed to cool naturally to room temperature (25° C.), was taking molecular orientation horizontal with respect to the substrate.

Note.
C: crystal, SmG: smectic G phase, SmF: smectic F phase, SmC: smectic C phase, N: nematic phase, I: isotropic liquid The four substrates prepared in (1-1) gave a dark field image under a polarizing microscope. Two out of the four substrates were set again on the vacuum evaporation system and heated at 150° C. for 3 minutes in a nitrogen atmosphere to exhibit a smectic liquid crystal phase. The substrates were taken out of the vacuum chamber and observed at room temperature under a polarizing microscope. A bright field image was observed (see FIG. 8).

Figure 9:
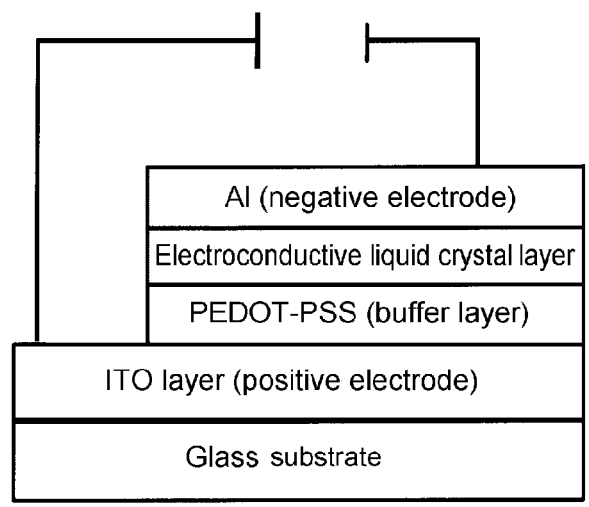
FIG. 9 is a schematic diagram of the device used to evaluate the electroconductivity (voltage vs. current) of the electroconductive liquid crystal semiconductor material layer prepared in Example.
Figure 10:
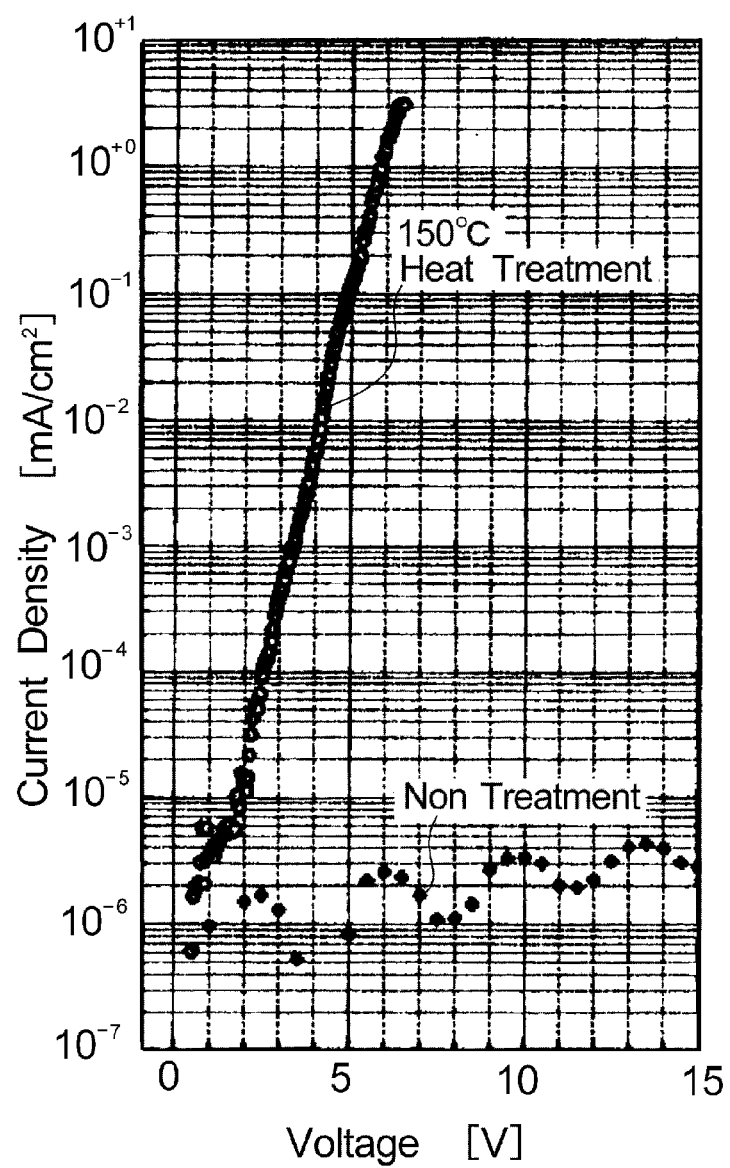
FIG. 10 is a graph showing the voltage vs. current relationship of the electroconductive liquid crystal semiconductor material layer prepared in Example and heat-treated to form a smectic liquid crystal phase, followed by cooling spontaneously to convert the liquid crystal phase into a solid phase, and the voltage vs. current relationship of the same electroconductive liquid crystal semiconductor material layer not having been heat treated.

The four substrates prepared in (1-1) were set again on the vacuum evaporation system, and aluminum was evaporated as an electrode on the electroconductive liquid crystal semiconductor material layer with a thickness of 300 nm containing the styryl derivatives to provide a device illustrated in FIG. 9. Positive voltage and negative voltage were applied to the ITO electrode and aluminum electrode, respectively, of the device and the amount of current passing through the device vs. voltage was measured. As a result, the substrates having been heated at 150° C. to exhibit a smectic liquid crystal state showed 1,000,000 times as high electroconductivity at a voltage of 6 V as those which have not been heat treated (see FIG. 10).

These results prove that, in the substrate which has been heat treated, the smectic liquid crystal molecular alignment is maintained even at room temperature and exhibits electroconductivity and optical anisotropy. In contrast, in the substrate which has not been heat treated, the liquid crystal compound has a random molecular orientation and is electrically insulating and exhibits no optical anisotropy. It has now been confirmed that selective heating produces a difference between an electroconductive state and an electrically nonconductive state and a difference in optical anisotropy.

(1-2)

Further, the following experiments were conducted to confirm whether data can be written with heating by a laser beam.

Four glass substrates (size 2×2 mm, thickness 0.7 mm) having an ITO electrode were spin coated with PEDOT-PSS. The unnecessary portion of the PEDOT-PSS on the substrate was removed with isopropyl alcohol, and then the PEDOT-PSS was cured by heating at 200° C. for 30 minutes to form a PEDOT-PSS layer (thickness 0.1 μm).

The substrates were set in a vacuum evaporation system and 40 mg of an equimolar mixture of the styryl derivatives obtained in Synthesis Examples 1 and 2 was placed on the sample board and was fitted to the vacuum evaporation system. The distance between the substrate and the evaporation material was set to 12 cm. Electrical current was applied to the sample board to carry out vacuum evaporation while monitoring the state of evaporation by means of a vacuometer. After completion of the vacuum evaporation, nitrogen gas was passed through a desiccant bed into the vacuum chamber for the system to return to atmospheric pressure. An electroconductive liquid crystal semiconductor material layer with a thickness of 300 nm containing the styryl derivatives was thus formed.

Figure 11:
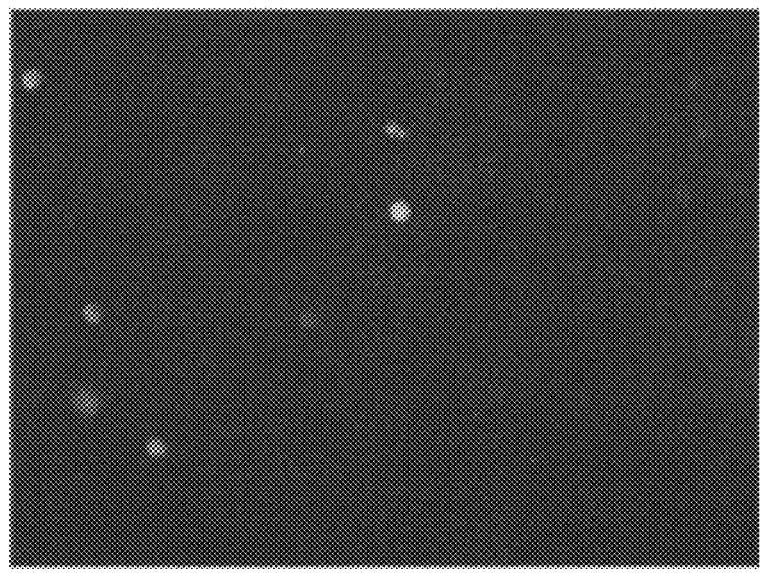
FIG. 11 shows polarizing microphotographs wherein it was observed that the spot of electroconductive liquid crystal material layer heat treated by spot irradiation with a laser beam is taking molecular orientation horizontal with respect to the substrate.

The four substrates prepared in (1-2) gave a dark field image under a polarizing microscope. These substrates were irradiated with a laser beam in spots of 100 μm diameter using a carbon dioxide laser machine (maximum output 30 W, wavelength 1050 nm). As a result, the substrates heat treated with a laser beam of an output of about $18 \times 10^3$ W/cm², gave a bright field image at room temperature under a polarizing microscope at the spot of laser irradiation (see FIG. 11).

Thus it was confirmed that the smectic liquid crystal molecular alignment formed by heat treatment with a laser beam is maintained even at room temperature and, moreover, only the spot heat treated with a laser beam possesses optical anisotropy.

The substrates prepared in (1-2) were set again on the vacuum evaporation system, and aluminum was evaporated as an electrode on the 300 nm-thick layer of compounds containing styryl derivatives to provide an device similar to the one described above (see FIG. 9). Positive voltage and negative voltage were applied to the ITO electrode and aluminum electrode, respectively, of the device and the amount of current passing through the device vs. voltage was measured. As a result, the substrate having been heat treated at 150° C. to exhibit a smectic liquid crystal state showed 1,000,000 times as high electroconductivity at a voltage of 6 V as those which have not been heat treated.

These results show that, in the substrate spot-irradiated by a laser beam, only the spot-irradiated portion became an elctroconductive spot where the smectic liquid crystal molecular alignment is maintained even at room temperature. On the other hand, the substrate, which has not been treated with a laser beam, had a random molecular orientation and was electrically insulating. Thus, it has now been confirmed that, depending on the presence or absence of the laser beam treatment, spots of electroconductive state and spots of electrically nonconductive state are produced.

(2-1)

Four glass substrates (size 2×2 mm, thickness 0.7 mm) having an ITO electrode were each spin coated with PEDOT-PSS. The unnecessary portion of the PEDOT-PSS on the substrate was removed with isopropyl alcohol, and the PEDOT-PSS was cured by heating at 200° C. for 30 minutes to form a PEDOT-PSS layer (thickness: 0.1 μm).

The substrates were set in a vacuum evaporation system, and 40 mg of an equimolar mixture of the styryl derivatives obtained in Synthesis Examples 1 and 2 was placed on the sample board. The angle of evaporation was 45°, and the distance between the substrate and the evaporation material was set to 12 cm. Electrical current was applied to the sample boat to carry out vacuum evaporation while monitoring the state of evaporation by means of a vacuometer. After completion of the vacuum evaporation, nitrogen gas passed through a desiccant bed into the vacuum chamber for the system to return to atmospheric pressure. An electroconductive liquid crystal layer of the styryl derivatives with a thickness of 300 nm containing the styryl derivatives was thus formed.

By using the vacuum deposition system, the substrate was then heated at 150° C. for 3 minutes in a nitrogen atmosphere to exhibit a smectic liquid crystal state. The molecular long axis direction of the liquid crystal compound was confirmed by a polarizing microscope. When a polarizing plate was placed with its transmission axis coincident with the molecular long axis direction, and the substrate was irradiated with nonpolarized ultraviolet light, blue polarized light having passed through the polarizing plate was observed (see FIG. 12(a)). When the transmission axis of the polarizing plate was then turned 90°, and the substrate was irradiated with nonpolarized ultraviolet light, there was observed no blue polarized light having passed through the polarizing plate (see FIG. 12(b)).

Figure 12:
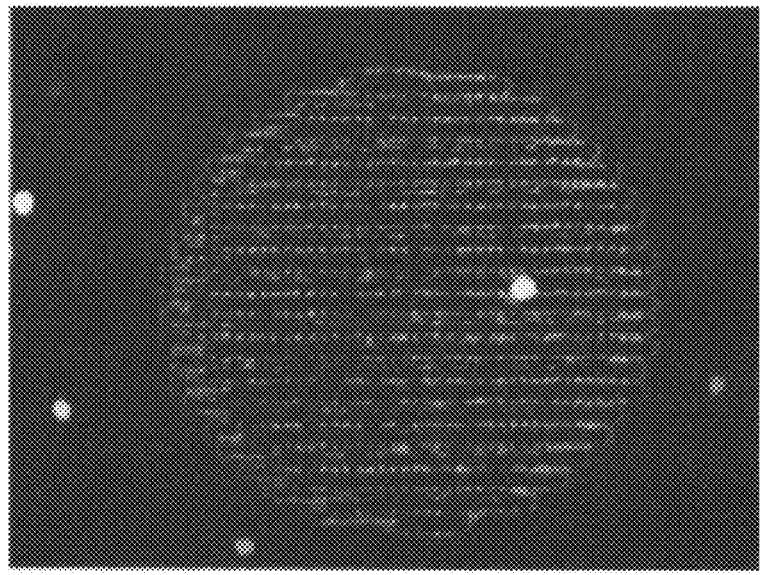
FIG. 12 shows polarizing microphotographs of the electroconductive liquid crystal semiconductor material layer prepared in Example after being heat treated at 150° C. for 3 minutes followed by being cooled to room temperature (25° C.) naturally into a solid phase, from which it is observed that the liquid crystal compound emits fluorescence polarized in the molecular long axis direction.
Figure 12:
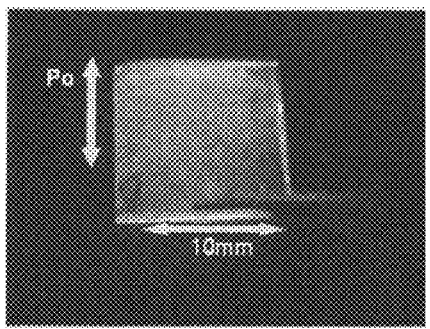
Figure 12:
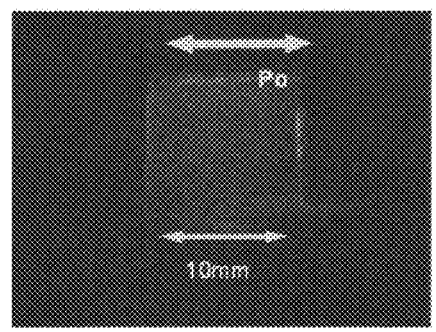

Light polarized in the direction indicated by the two-headed arrow in FIG. 12(a) was emitted from the substrate, and it can be read with a polarizing plate having its transmission axis coincident with the polarization direction.

Figure 13:
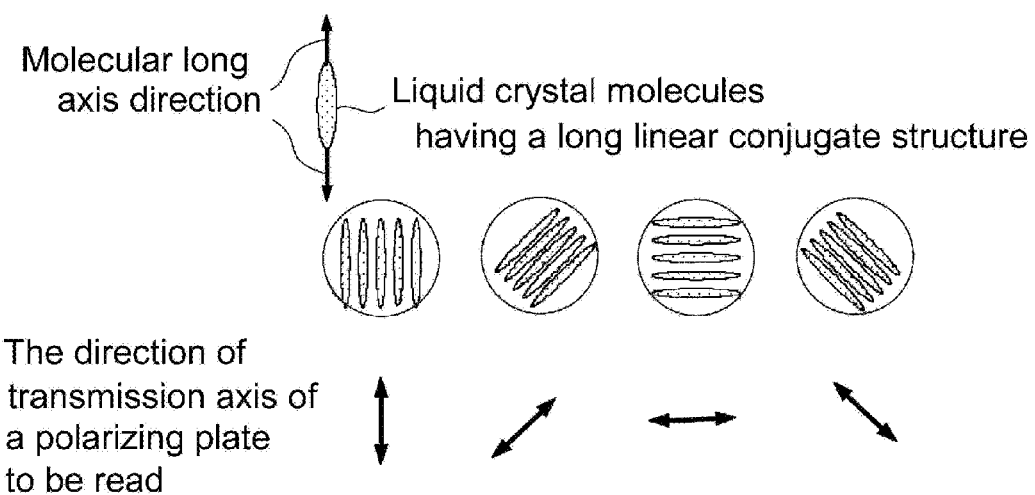
FIG. 13 schematically illustrates the relation between the long axis direction of liquid crystal molecules and the transmission axis of a polarizing plate used for data reading in an embodiment of a memory device of the present invention.

Accordingly, the difference in molecular long axis direction of the liquid crystal semiconductor material enables multiplex writing and each piece of written information can be read by aligning the angle of the transmission axis of the polarizing plate with each of the molecular long axis (see FIG. 13).

INDUSTRIAL APPLICABILITY

As described in detail hereinbefore, in the memory device of the present invention, the information memory cell can be prepared by a simple process such as coating of a semiconductor coating liquid, vacuum evaporation in a room temperature range, and the like. Further, data recording can be carried out by a simple operation such as spot irradiation with a laser beam. Therefore, by using the memory device, the IC tag can be produced by printing methods and simple processes through the production of the memory devices to the preparation of the IC tags.

The invention claimed is:

1. A memory device for storing information by making use of a molecular alignment of a liquid crystal compound in a liquid crystalline state, the molecular alignment being formed by spot irradiation with a laser beam to carry out a selective heat treatment on an electroconductive liquid crystal semiconductor material layer containing a liquid crystal compound, comprising:
    a first electrode group including a plurality of linear electrodes which are parallel to each other;
    an electroconductive liquid crystal semiconductor material layer formed in such a manner that the layer covers the first electrode group, the layer containing a liquid crystal compound having a long linear conjugate structural moiety and exhibiting a smectic phase as a liquid crystal phase; and
    a second electrode group formed on the electroconductive liquid crystal semiconductor material layer and including a plurality of linear transparent electrodes which are parallel to each other and extend in a direction intersecting with the first electrode group.

2. The memory device according to claim 1, which is capable of storing information by a difference between an electroconductive spot and a nonconductive spot, and a difference in optical anisotropy of the electroconductive spot and the nonconductive spot, and is capable of reading information by any of two different methods of an electrical method and an optical method,
    the electroconductive spot has both electroconductivity and optical anisotropy at the same time, and is formed by selectively heat treating the electroconductive liquid crystal semiconductor material layer containing the liquid crystal compound having no liquid crystal molecular orientation with spot irradiation of a laser beam thereby generating molecular alignment of the liquid crystal compound in a liquid crystal state.

3. The memory device according to claim 1, wherein the liquid crystal compound is a styryl derivative represented by general formula (1):

[Formula 1]

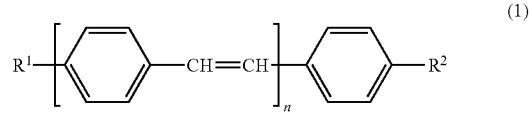

wherein $R^1$ and $R^2$, which may be the same or different, each represent a straight-chain or branched alkyl group, a straight-chain or branched alkoxy group, a cyano group, a nitro group, F, —C(O)O(CH$_2$)$_m$—CH$_3$, —C(O)—(CH$_2$)$_m$—CH$_3$, or a group represented by general formula (2) below;

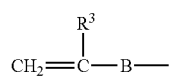

(2)

wherein R$^3$ represents a hydrogen atom or a methyl group; B represents —(CH$_2$)$_m$—, —(CH$_2$)$_m$—O—, —CO—O—(CH$_2$)$_m$—, —C$_6$H$_4$—CH$_2$—O— or —CO—, m represents an integer of 1 to 18, and n represents an integer of 2 to 3.

4. The memory device according to claim 3, wherein the electroconductive liquid crystal semiconductor material layer contains two or more kinds of compounds selected from the styryl derivative represented by general formula (1) having an alkyl group of a different chain length.

5. A data writing method using the memory device according to claim 1, comprising heat treating the electroconductive liquid crystal semiconductor material layer containing the liquid crystal compound by spot irradiation of a laser beam passed through the transparent electrode.

6. The data writing method according to claim 5, wherein a cross point of the electrode of the first electrode group and the transparent electrode of the second electrode group is heat treated by spot irradiation of a laser beam.

7. The data writing method according to claim 5, wherein the electroconductive liquid crystal semiconductor material layer containing the liquid crystal compound is selectively heat treated by spot irradiation of a laser beam to carry out optical multiplex recording in one spot which is formed by molecular alignment of the liquid crystal compound in a liquid crystal phase and is capable of emitting fluorescence polarized in a molecular long axis direction of the liquid crystal compound.

8. A data reading method for reading multiply-recorded data written by the data writing method according to claim 7, comprising irradiating the spot which is capable of emitting fluorescence polarized in a molecular long axis direction of the liquid crystal compound with exciting light, and aligning a transmission axis of a polarizing plate with an oscillation direction of the polarized fluorescence.

9. An IC tag comprising the memory device according to claim 1.

* * * * *